United States Patent
Lee et al.

(10) Patent No.: US 11,183,835 B2
(45) Date of Patent: Nov. 23, 2021

(54) SHORT CIRCUIT DETECTION AND PROTECTION FOR A GATE DRIVER CIRCUIT AND METHODS OF DETECTING THE SAME USING LOGIC ANALYSIS

(71) Applicant: Infineon Technologies Austria AG, Villach (AT)

(72) Inventors: Minsub Lee, Cheonan-si (KR); Junbae Lee, Seoul (KR)

(73) Assignee: Infineon Technologies Austria AG

( * ) Notice: Subject to any disclaimer, the term of this patent is extended or adjusted under 35 U.S.C. 154(b) by 123 days.

(21) Appl. No.: 16/512,576

(22) Filed: Jul. 16, 2019

(65) Prior Publication Data
US 2021/0021121 A1  Jan. 21, 2021

(51) Int. Cl.
| | |
|---|---|
| *H02H 7/122* | (2006.01) |
| *H02H 1/00* | (2006.01) |
| *H03K 17/08* | (2006.01) |
| *G01R 31/52* | (2020.01) |

(52) U.S. Cl.
CPC ............ *H02H 7/1227* (2013.01); *G01R 31/52* (2020.01); *H02H 1/0007* (2013.01); *H03K 17/08* (2013.01); *H03K 2217/0063* (2013.01); *H03K 2217/0072* (2013.01)

(58) Field of Classification Search
CPC ................. H02M 3/156; H02M 3/158; H02M 2001/0025; H02M 2001/0032; H02M 1/32; H02H 7/1227; H02H 1/0007; H03K 17/08; H03K 2217/0063; H03K 2217/0072
See application file for complete search history.

(56) References Cited

U.S. PATENT DOCUMENTS

| | | |
|---|---|---|
| 9,366,717 B2 | 6/2016 | Rätz |
| 9,606,184 B2 | 3/2017 | Hornstein et al. |
| 2004/0120090 A1 | 6/2004 | Galli et al. |
| 2011/0169470 A1* | 7/2011 | Itakura .................... H02M 1/32 323/282 |
| 2016/0018446 A1 | 1/2016 | Chen et al. |
| 2016/0124037 A1 | 5/2016 | Zhang et al. |

(Continued)

FOREIGN PATENT DOCUMENTS

| | | |
|---|---|---|
| EP | 2930846 A4 | 8/2016 |
| EP | 3076549 A1 | 10/2016 |

(Continued)

*Primary Examiner* — Rafael O De Leon Domenech
(74) *Attorney, Agent, or Firm* — Design IP

(57) ABSTRACT

A gate driver circuit is provided that includes a high-side power transistor; a low-side power transistor coupled to the high-side power transistor, where an output voltage is generated at a load node coupled between the low-side power transistor and the high-side power transistor; a gate driver configured to receive a high-side control signal and a low-side control signal, drive the high-side power transistor based on the high-side control signal, and drive the low-side power transistor based on the low-side control signal; and a short circuit detection circuit configured to monitor for short circuit events at the high-side power transistor and at the low-side power transistor based on the high-side control signal, the low-side control signal, and the output voltage, and, generate a fault signal in response to detecting a short circuit event at either of the high-side power transistor or the low-side power transistor.

23 Claims, 4 Drawing Sheets

(56) References Cited

U.S. PATENT DOCUMENTS

| | | | |
|---|---|---|---|
| 2017/0248646 A1 | 8/2017 | Mauder et al. | |
| 2017/0276715 A1 | 9/2017 | Heinz et al. | |
| 2018/0102773 A1 | 4/2018 | Li et al. | |
| 2018/0115310 A1* | 4/2018 | Horiguchi | G01R 31/27 |
| 2018/0234088 A1 | 8/2018 | Narayanasamy et al. | |
| 2018/0259583 A1 | 9/2018 | Jung et al. | |
| 2020/0127657 A1* | 4/2020 | Masuhara | H02M 1/08 |

FOREIGN PATENT DOCUMENTS

| | | |
|---|---|---|
| EP | 3340457 A4 | 4/2019 |
| GB | 2564701 A | 1/2019 |
| KR | 20180067132 A | 6/2018 |

* cited by examiner

SHORT CIRCUIT DETECTION AND PROTECTION FOR A GATE DRIVER CIRCUIT AND METHODS OF DETECTING THE SAME USING LOGIC ANALYSIS

FIELD

The present disclosure relates generally to gate drivers and to methods for detecting short circuits through high-side and low-side switching devices.

BACKGROUND

A high voltage (HV) gate driver circuit may include a low voltage (LV) gate driver used to drive a low-side transistor switch and an HV gate driver used to drive a high-side transistor switch. In a drive system of a full bridge, a half bridge, and three phase, there are several protection methods for prevention of device destruction due to a short circuit situation such as shunt resistor circuit and desaturation (DESAT) function (i.e., a desaturation fault detection circuit). However, these protection methods are typically not activated at specified conditions. This means several functions are required to protect both high-side and low-side transistor switches.

A DESAT function is activated at short circuit situation only for the high-side switching device (i.e., the high-side transistor switch). A major problem of the DESAT function is that an additional circuit is required for transferring a fault signal from the high voltage integrated circuit (IC) to a low voltage IC of the gate driver circuit where the high voltage IC and the low voltage IC are located in different voltage domains.

On the other hand, a shunt resistor circuit cannot detect a high-side ground fault.

Therefore, an improved device capable of detecting faults at both the high-side and the low-side switching devices may be desirable.

SUMMARY

Embodiments provide a gate driver circuit that includes a high-side power transistor; a low-side power transistor coupled to the high-side power transistor, where an output voltage is generated at a load node coupled between the low-side power transistor and the high-side power transistor; a gate driver configured to receive a high-side control signal and a low-side control signal, drive the high-side power transistor based on the high-side control signal, and drive the low-side power transistor based on the low-side control signal; and a short circuit detection circuit configured to monitor for short circuit events at the high-side power transistor and at the low-side power transistor based on the high-side control signal, the low-side control signal, and the output voltage, and, generate a fault signal in response to detecting a short circuit event at either of the high-side power transistor or the low-side power transistor.

Embodiments provide a method of detecting short circuit events in an inverter leg of an inverter. The method includes receiving a high-side control signal and a low-side control signal; driving a high-side power transistor of the inverter leg based on the high-side control signal; driving a low-side power transistor based on the low-side control signal; generating an output voltage at a load node coupled between the low-side power transistor and the high-side power transistor based on driving the high-side power transistor and driving the low-side power transistor; monitoring for short circuit events at the high-side power transistor and at the low-side power transistor based on the high-side control signal, the low-side control signal, and the output voltage; and generating a fault signal in response to detecting a short circuit event at either of the high-side power transistor or the low-side power transistor.

BRIEF DESCRIPTION OF THE DRAWINGS

Embodiments are described herein making reference to the appended drawings.

DETAILED DESCRIPTION

Figure 1:
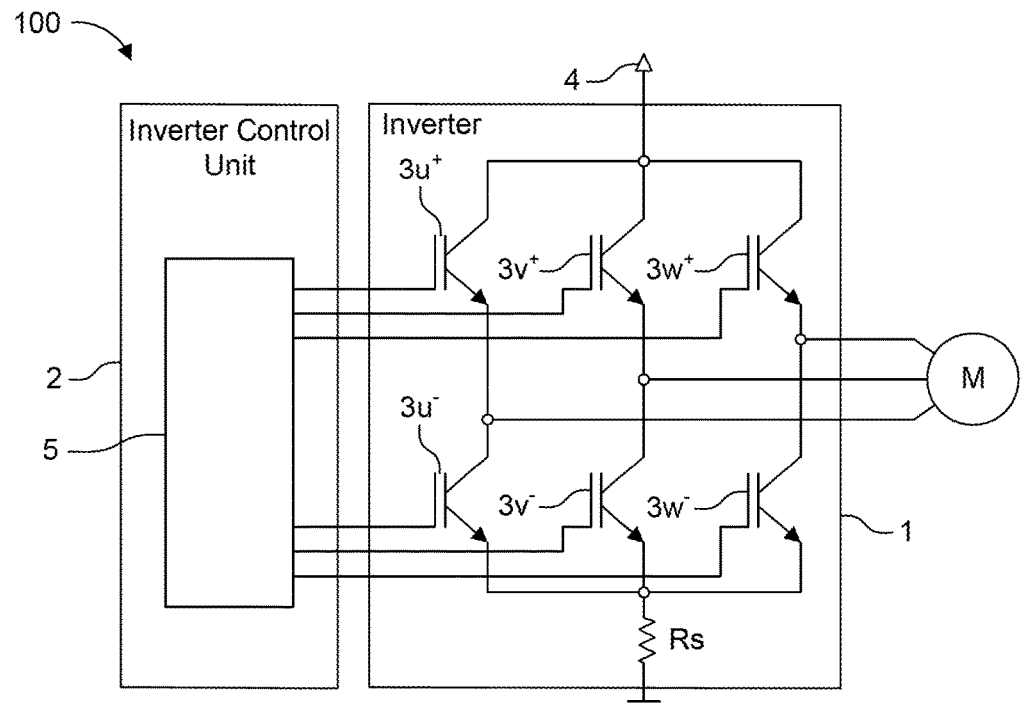
FIG. 1 is a schematic block diagram illustrating a motor control actuator of a power semiconductor device according to one or more embodiments.

In the following, details are set forth to provide a more thorough explanation of the exemplary embodiments. However, it will be apparent to those skilled in the art that embodiments may be practiced without these specific details. In other instances, well-known structures and devices are shown in block diagram form or in a schematic view rather than in detail in order to avoid obscuring the embodiments. In addition, features of the different embodiments described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

In this regard, directional terminology, such as "top", "bottom", "below", "front", "behind", "back", "leading", "trailing", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope defined by the claims. The following detailed description, therefore, is not to be taken in a limiting sense.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In embodiments described herein or shown in the drawings, any direct electrical connection or coupling, i.e., any connection or coupling without additional intervening elements, may also be implemented by an indirect connection or coupling, i.e., a connection or coupling with one or more additional intervening elements, or vice versa, as long as the general purpose of the connection or coupling, for example, to transmit a certain kind of signal or to transmit a certain kind of information, is essentially maintained. Features from different embodiments may be combined to form further embodiments. For example, variations or modifications described with respect to one of the embodiments may also be applicable to other embodiments unless noted to the contrary.

The term "substantially" may be used herein to account for small manufacturing tolerances (e.g., within 5%) that are deemed acceptable in the industry without departing from the aspects of the embodiments described herein.

A sensor may refer to a component which converts a physical quantity to be measured to an electric signal, for example, a current signal or a voltage signal. The physical quantity may, for example, be a current or a voltage at a shunt resistor in a single-shunt resistor system.

A signal processing circuit and/or a signal conditioning circuit may receive one or more signals from one or more components and perform signal conditioning or processing thereon. Signal conditioning, as used herein, refers to manipulating a signal in such a way that the signal meets the requirements of a next stage for further processing. Signal conditioning may include converting from analog to digital (e.g., via an analog-to-digital converter), amplification, filtering, converting, biasing, range matching, isolation and any other processes required to make a signal suitable for processing after conditioning.

Thus, a signal processing circuit may include an analog-to-digital converter (ADC) that converts the analog signal from the one or more sensor elements to a digital signal. The signal processing circuit may also include a digital signal processor (DSP) that performs some processing on the digital signal.

Many functions of modern devices in automotive, consumer and industrial applications, such as converting electrical energy and driving an electric motor or an electric machine, rely on power semiconductor devices. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a semiconductor structure configured to conduct a load current along a load current path between two load terminal structures or load electrodes (e.g., the source/emitter and the drain/collector) of the device. Further, the load current path may be controlled by means of a control electrode, sometimes referred to as gate electrode. For example, upon receiving a corresponding control signal from, e.g., a driver unit, the control electrode may set the power semiconductor device in one of a conducting state or a blocking state. A control signal may by a voltage signal or a current signal having a controlled value.

A power transistor, also referred to as a power switch or a transistor switch, is a power semiconductor device that may be used to drive a load current ILOAD. For example, an IGBT is turned "ON" or "OFF" by activating and deactivating its gate terminal. Applying a positive input voltage signal across the gate and the emitter will keep the device in its "ON" state, while making the input gate signal zero or slightly negative will cause it to turn "OFF". There is a turn-on process and a turn-off process for switching the power transistor on and off.

During the turn-on process, a gate driver integrated circuit (IC) may be used to provide (source) a gate current (i.e., an ON current) to the gate of the power transistor in order to charge the gate to a sufficient voltage to turn on the device. In particular, current Io+ is a gate driver output current used to rise (i.e., charge) the gate of the power transistor during a turn on transient. Thus, it is used to turn on the power transistor.

In contrast, during the turn-off process, the gate driver IC is used to draw (sink) a gate current (i.e., an off current) from the gate of the power transistor in order to discharge the gate sufficiently to turn off the device. Current Io– is a gate driver output current used to discharge the gate of the power transistor during a turn off transient. Thus, it is used to turn off the power transistor.

A voltage pulse may be output from the gate driver IC as the control signal according to a pulse width modulation (PWM) scheme. Thus, the control signal may be switched between an ON voltage level and an OFF voltage level during a PWM cycle for controlling a power transistor. This in turn charges and discharges the gate voltage to turn on and off the power transistor, respectively.

In particular, the gate of a power transistor is a capacitive load, and the turn ON current (i.e., gate source current) and the turn OFF current (i.e., gate sink current) are specified as the initial current when a switching event is initiated. During a turn OFF event, after some small amount of time (small compared to the PWM period), the gate current decreases and reaches a zero value when the gate reaches 0V. During a turn ON event, after some small amount of time (small compared to the PWM period), the gate current decreases and reaches a zero value when the gate reaches 15V.

Transistors may include Insulated Gate Bipolar Transistors (IGBTs) and Metal Oxide Semiconductor Field Effect Transistors (MOSFETs) (e.g., Si MOSFETs or SiC MOSFETs). While IGBTs may be used as an example in the embodiments below, it will be appreciated that MOSFETs may be substituted for the IGBTs and vice versa. In this context, when substituting a MOSFET for an IGBT, a MOSFET's drain may be substituted for an IGBT's collector, the MOSFET's source may be substituted for the IGBT's emitter, and the MOSFETs drain-source voltage Vis may be substituted for the IGBT's collector-emitter voltage $V_{CE}$ in any one of the examples described herein. Thus, any IGBT module may be substituted by a MOSFET module and vice versa.

Specific embodiments described in this specification pertain to, without being limited thereto, a power semiconductor device that may be used within a power converter or a power supply. Thus, in an embodiment, the power semiconductor device may be configured to carry a load current that is to be supplied to a load and/or, respectively, that is provided by a power source. For example, the semiconductor device may comprise one or more power semiconductor cells, such as a monolithically integrated diode cell, and/or a monolithically integrated transistor cell. Such diode cell and/or such transistor cells may be integrated in a power semiconductor module.

Power semiconductor devices that include transistors which are suitably connected to form half-bridges are commonly used in the field of power electronics. For example, half-bridges may be used for driving electric motors or switched mode power supplies.

For example, a multi-phase inverter is configured to provide multi-phase power by supplying multiple phase loads (e.g., a three-phase motor). For instance, three-phase power involves three symmetrical sine waves that are 120 electrical degrees out of phase with one another. In a symmetric three-phase power supply system, three conductors each carry an alternating current (AC) of the same frequency and voltage amplitude relative to a common reference but with a phase difference of one third the period. Due to the phase difference, the voltage on any conductor reaches its peak at one third of a cycle after one of the other conductors and one third of a cycle before the remaining conductor. This phase delay gives constant power transfer to a balanced linear load. It also makes it possible to produce a rotating magnetic field in an electric motor.

In a three-phase system feeding a balanced and linear load, the sum of the instantaneous currents of the three conductors is zero. In other words, the current in each conductor is equal in magnitude to the sum of the currents in the other two, but with the opposite sign. The return path for the current in any phase conductor is the other two phase conductors. The instantaneous currents result in a current space vector.

A three-phase inverter includes three inverter legs, one for each of the three phases, and each inverter leg is connected to a direct current (DC) voltage source in parallel to each other. Each inverter leg includes a pair of power transistors, for example, arranged in a half-bridge configuration for converting DC to AC. In other words, each inverter leg includes two complementary transistors (i.e., a high-side transistor and a low-side transistor) connected in series and which switch on and off complementary to the each other for driving a phase load. However, multi-phase inverters are not limited to three phases, and may include two phases or more than three phases, with an inverter leg for each phase.

FIG. 1 is a schematic block diagram illustrating a motor control actuator 100 of a power semiconductor device according to one or more embodiments. In particular, the motor control actuator 100 includes a power inverter 1 and an inverter control unit 2. The inverter control unit 2 behaves as a motor control unit and thus may also be referred to as a motor controller or a motor control IC. The motor control unit may be a monolithic IC or may be split into a microcontroller and a gate driver on two or more ICs.

The motor control actuator 100 is further coupled to a three-phase motor M, that includes three phases U, V, and W. The power inverter 1 is a three-phase current generator configured to provide three-phase power by supplying three phase currents to drive the motor M. It will be further appreciated that the power inverter 1 and the inverter control unit 2 may be placed on a same circuit board, or on separate circuit boards.

Deviations in both magnitude and phase may case a loss in power and torque in the motor M. Therefore, the motor control actuator 100 may be configured to monitor and control the magnitude and phase of the currents supplied to the motor M in real-time to ensure the proper current balance is maintained based on a feedback control loop. Open loop motor control units also exist and may be implemented.

The power inverter 1 includes a switching array of six transistor modules 3u+, 3u−, 3v+, 3v−, 3w+, and 3w− (collectively referred to as transistor modules 3) arranged in complementary pairs. Each complementary pair constitutes one inverter leg that supplies a phase current to the three-phase motor M. Thus, each inverter leg includes an upper (high-side) transistor module 3 and a lower (low-side) transistor module 3. Each transistor module may include one transistor, and may also include a diode (not shown). Thus, each inverter leg includes an upper transistor (i.e., a high-side switch) and a lower transistor (i.e., a low-side switch). Load current paths U, V, and W extend from an output of each inverter leg (i.e., the output of each half-bridge) located between complementary transistors and are configured to be coupled to a load, such as motor M. The power inverter 1 is coupled to a DC power supply 4 (e.g., a battery or a diode bridge rectifier) and to the inverter control unit 2.

In this example, the inverter control unit 2 includes a motor control circuit and a gate driver circuit for controlling the switching array. In some examples, the inverter control unit 2 may be monolithic in which the motor control circuit and gate driver circuit are integrated onto a single die. In other examples, the motor control circuit and gate driver circuit may be partitioned as separate ICs. A "monolithic" gate driver is a gate driver on a single silicon chip and may be further made with specific high voltage (HV) technology. Furthermore, the gate driver IC may be integrated on the power inverter 1 to form a power module.

The motor controller IC performs the motor control function of the motor control actuator 100 in real-time. Motor control function can include either controlling a permanent magnet motor or an induction motor and can be configured as a sensorless control not requiring the rotor position sensing, as a sensor based control with Hall sensors and/or an encoder device, or as a combination of both sensor based control (e.g., used at lower rotor speeds) and sensorless control (e.g., used at higher rotor speeds).

For example, the inverter control unit 2 includes a controller and driver unit 5 that includes a microcontroller unit (MCU) as the motor controller IC and a gate driver IC for generating driver signals for controlling the transistors of each transistor module 3. Thus, load current paths U, V, and W may be controlled by the controller and driver unit 5 by means of controlling the control electrodes (i.e., gate electrodes) of the transistors 3. For example, upon receiving a control signal from the microcontroller, the gate driver IC may set a corresponding transistor in one of a conducting state (i.e., on-state) or a blocking state (i.e., off-state).

The gate driver IC may be configured to receive instructions, including the power transistor control signals, from the MCU, and turn on or turn off respective transistors 3 in accordance with the received instructions and control signals. For example, during the turn-on process of a respective transistor 3, the gate driver IC may be used to provide (source) a gate current to the gate of the respective transistor 3 in order to charge the gate. In contrast, during the turn-off process, the gate driver IC may be used to draw (sink) a gate current from the gate of the transistor 3 in order to discharge the gate.

The inverter control unit 2 or the controller and driver unit 5 itself may include a PWM controller, an ADC, a DSP, and/or a clock source (i.e., a timer or counter) used in implementing a PWM scheme for controlling the states of each transistor, and, ultimately, each phase current provided on the respective load current paths U, V, and W.

In particular, the microcontroller of the controller and driver unit 5 may use a motor control algorithm, such as a field-oriented control (FOC) algorithm, for providing current control in real-time for each phase current output to a multi-phase load, such a multi-phase motor. Motor speed may further be controlled by adding a speed control loop on top of FOC control. Thus, FOC may be considered as an inner control loop and a speed control loop may be considered as an outer control loop. In some cases, motor position may be controlled using a third control loop (e.g., a position control loop) outside of the speed control loop.

For example, during FOC, a motor phase current should be measured such that an exact rotor position can be determined in real-time. To implement the determination of the motor phase current, the MCU 5 may employ an algorithm (e.g., space vector modulation (SVM), also referred as space vector pulse width modulation (SVPWM)) that uses single-shunt current sensing.

Furthermore, the switches 3 (i.e., transistors) of the power inverter 1 are controlled so that at no time are both switches in the same inverter leg turned on or else the DC supply would be shorted. This requirement may be met by the complementary operation of the switches 3 within an inverter leg according to the motor control algorithm.

Figure 2:
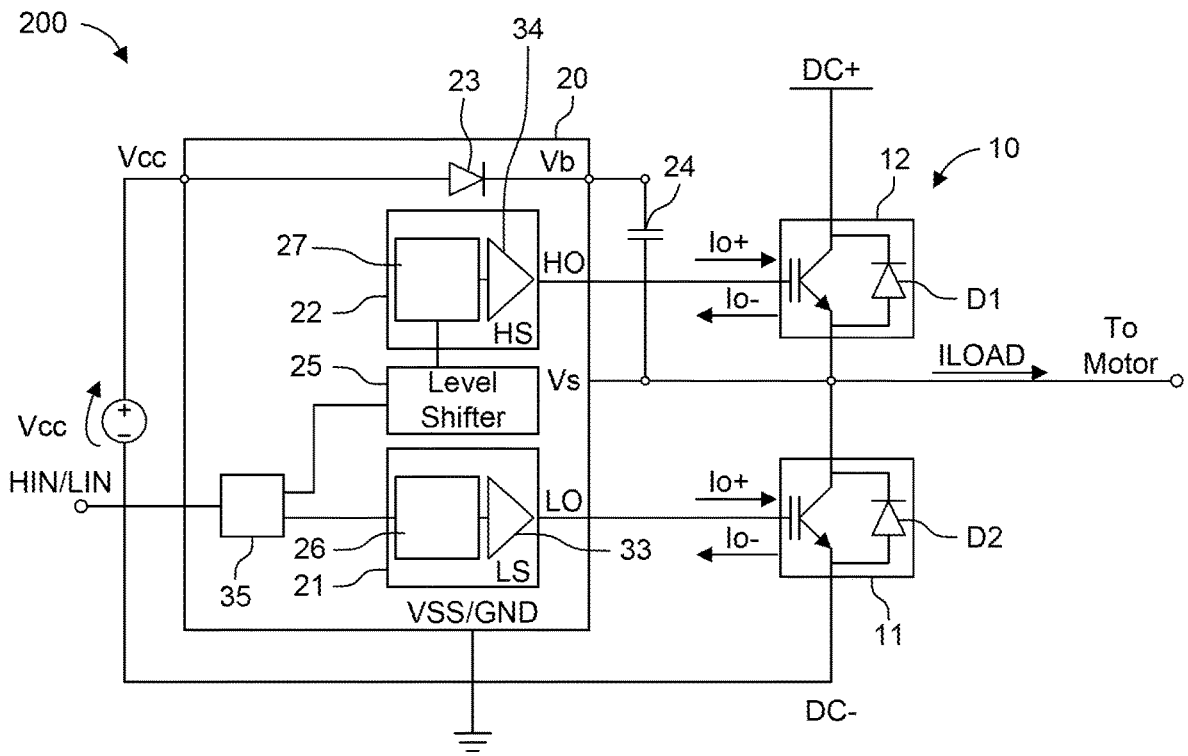
FIG. 2 is a schematic block diagram of a power module according to one or more embodiments.

FIG. 2 is a schematic block diagram of a power module 200 according to one or more embodiments. The power module 200 includes a single-phase motor drive stage 10 (i.e., an inverter leg) and a gate driver IC 20 electrically coupled to the single-phase motor drive stage 10. However, the single-phase motor drive stage may be expanded to a multiple-phase motor drive state by adding additional inverter legs. Both the single-phase motor drive stage 10 and the gate driver IC 20 are integrated into a single package (not illustrated). Thus, the power module 200 is packaged as a single device.

The single-phase motor drive stage 10 includes a low-side transistor 11 and a high-side transistor 12 that are controlled for supplying a load current $I_{LOAD}$ to a one phase of a motor (not illustrated). Freewheeling diodes D1 and D2 coupled to their respective power transistors 11 and 12 are also shown.

The gate driver 20 is a monolithic high voltage (HV) gate driver, that includes a low voltage (LV) gate driver 21 used to drive the low-side transistor switch 11 and an HV gate driver 22 used to drive the high-side transistor switch 12. Both gate drivers 21 and 22 perform gate driving of their respective power transistor 11 and 12 based on PWM signals LIN and HIN received from a microcontroller unit (MCU). The PWM signals are control signals received from the MCU at PWM logic unit 35 of the gate driver 20. The PWM logic unit 35 receives the LIN and HIN signals from the MCU and ensures there is a minimum dead time or blanking time implemented to prevent bridge shoot through. Eventually, the respective PWM signals are passed on to the respective low-side and high-side gate driver 21 and 22, where the PWM signal HIN to the high-side gate driver 22 is passed through a HV level shifter 25. After this point, the low-side and high-side gate driver 21 and 22 perform gate driving.

Both gate drivers 21 and 22 include separate pre-driver circuitry 26 and 27 and buffers 33 and 34, respectively. The pre-driver circuitries 26 and 27 are configured to receive the PWM signals and, based thereon, control the on/off state of a respective first current source, such as a source FET, used to generate current Io+. Additionally, the pre-driver circuitries 26 and 27 are configured to receive the PWM signals and, based thereon, control the on/off state of a respective second current source, such as a sink FET, used to generate current Io−. The respective current sources are provided in buffers 33 and 34. Thus, the buffers 33 and 34 may each include a pair of complementary FETs used to generate turn-on currents Io+ and turn-off currents Io− for the respective power transistor 11 and 12. Each of the pre-driver circuitries 26 and 27 may further command a respective buffer 33 or 34 to use a certain current capability.

The LV gate driver 21 is arranged in a low-side region having low voltage domain, whereas the HV gate driver is arranged in high-side region having a high voltage domain. In practice, the gate driver 20 also includes a termination region that isolates the high voltage domain from the low voltage domain, and may be referred to as an isolation termination region. Thus, the termination region provides a high voltage isolation barrier between the two voltage domains.

The gate driver 20 may be configured to receive PWM control signals, from an MCU, and turn on or turn off respective transistors 11 and 12 in accordance with the received PWM control signals. For example, during the turn-on process of a respective transistor 11 or 12, the gate driver 20 may be used to provide (source) a gate current to the gate of the respective transistor 11/12 in order to charge the gate. In contrast, during the turn-off process, the gate driver 20 may be used to draw (sink) a gate current from the gate of the transistor 11/12 in order to discharge the gate.

Thus, the MCU is electrically coupled to the gate driver 20 for the transmission of information and control signals therebetween, and the gate driver 20 is electrically coupled to the inverter leg 10 for driving the power transistors thereof.

The three regions, the HV domain, the LV domain, and the termination region are monolithically built in a single integrated circuit. The technology used to manufacture the gate driver 20 is capable of building all three regions on a single silicon die and build a single IC gate driver. In between the HV domain and the LV domain is the termination region whose main purpose is to electrically isolate the HV domain and the LV domain. The termination region in this specific technology (and in other high voltage technologies) includes a large diode used as bootstrap diode 23 to charge a bootstrap capacitor 24. The level shifter 25 is used to convert (i.e., level shift) the control signals, and thus transfer control information, from the low voltage/power domain to the high voltage/power domain.

In addition, Vb refers to the high-side floating supply voltage; Vs refers to the high-side floating ground voltage; Vdd or Vcc refers to the low-side and logic fixed supply voltage; Vss or Vee refers to a low-side ground voltage; HO refers to the high-side floating output voltage; LO refers to the low-side output voltage; DC+ refers to DC-link positive; DC− refers to DC-link negative; and HIN and LIN refers to the logic input voltages (i.e., control signals) received from the MCU.

Typically, Vb=Vcc−Vs−Vd, where Vd is the voltage drop across the bootstrap diode 23. When Vcc=15V, Vs=0V, and the bootstrap diode 23 is forward biased and has a forward bias voltage drop of Vd=0.5V, then Vb=15V−−0V−0.5V=14.5V That is, during normal operation Vb is about 15V above Vs due to the bootstrap capacitor 24 supplying to the high side. DC+, positive power supply rail, is typically in the range of 200-1200V, but not limited thereto. On top of this, Vs is equal to DC− (e.g., Vss or 0V) when the low side switch 11 is on (and switch 12 is off). DC− is a negative power supply rail and may be shorted to Vss, as shown, but need not be. In this case, Vb is near 15V and the bootstrap capacitor 24 is charging by Vcc through the bootstrap diode 23. Otherwise, Vs is equal to DC+ when the high side switch 12 is on (and switch 11 is off), in this case Vb is 15V above DC+ and the bootstrap capacitor 24 is slowly discharging, being that the bootstrap diode 23 is reverse biased and non-conducting.

The aforementioned voltages are set such that the high-side voltage domain operates in a higher voltage or power domain than that of the low-side voltage domain. For example, the low-side (external) supply voltage Vcc may be set to 15V and the high-side supply voltage Vb may be operated at a maximum voltage of 1215V when DC+ is 1200V.

The MCU, being coupled to the LV gate driver 21, is electrically coupled to the LV domain of the gate driver IC 20. Thus, the MCU is configured to generate PWM control signals HIN and LIN for controlling the transistors 11 and 12, and transmit the control signals to the gate driver IC 20 at the LV domain. For example, the gate driver IC 20 is configured to receive instructions from the MCU to drive a motor phase (i.e., an inverter leg) connected to voltage Vs using the PWM control signals HIN and LIN, which are complementary to each other. When input control signal HIN is high, transistor 12 is turned on. Conversely, when input control signal LIN is high, transistor 11 is turned on.

These PWM control signals are received by the gate driver IC 20 at the LV domain (i.e., at input pins HIN and LIN) and passed through to the corresponding HV gate driver 22 and the LV gate driver 21 via the appropriate logic (e.g., the PWM logic 35 and, for the high-side, the level shifter 25). The LV gate driver 21 and the HV gate driver 22 and are configured to receive the PWM control signals and drive the corresponding power transistor 11 and 12 via output terminals HO and LO of the gate driver IC 20.

According to one or more embodiments, the relationship between the output voltage Vout and the input control signals HIN and LIN can be logically analyzed, as shown in Table 1, in order detect the short circuit status both the high-side device 12 and low-side switching device 11 using a single function. In other words, a short circuit event at the low-side switching device 11 as well as a desaturation/short circuit event at the high-side switching device 12 can be detected using a single function. Furthermore, an additional circuit for transferring a fault signal from the HVIC to LVIC is needed because the analysis is performed in the low voltage domain.

TABLE 1

| Switching mode | High-side input signal HIN | Low-side input signal LIN | Output voltage Vout | Result |
|---|---|---|---|---|
| High-side switching | High | Low | High | Normal operation |
|  | High | Low | Low | Abnormal operation |
| Low-side switching | Low | High | Low | Normal operation |
|  | Low | High | High | Abnormal operation |

In Table 1, input signal "High" means that the respective switching device 11 or 12 is turned on, while input signal "Low" means that the switching device 11 or 12 is turned off. This logic only considers the "turn on" status of the relevant switching devices and input control signals, as will be described in further detail. In addition, a blanking time may be inserted between the beginning of the turn-on control signal (i.e., high LIN and high HIN) and the point at which desaturation detection is activated at a logic analysis unit in order to avoid false detection.

In normal operation mode, during a positive area of sinusoidal output current, the output voltage Vout is swept from 0V to VDC (i.e., the DC+ of the power supply rail) according to the high-side input signal (HIN). Thus, when the high-side input signal (HIN) is 0V, the high-side switching device 12 is turned off and Vout=0V. In contrast, when HIN is 5V, the high-side switching device 12 is turned on and Vout=VDC.

In normal operation mode, during a negative area of sinusoidal output current, the output voltage Vout is swept from 0V to VDC (i.e., the DC+ of the power supply rail) according to the low-side input signal (LIN). Thus, when the low-side input signal (LIN) is 0V, the low-side switching device 11 is turned off and Vout=VDC. In contrast, when LIN is 5V, the low-side switching device 11 is turned on and Vout=0.

During an abnormal operation mode (i.e., in a short circuit situation), a high-side short event or a low-side short event may exist. During a high-side short event, Vout may be maintained at VDC regardless of input control signals HIN and LIN. During a low-side short event, Vout may be maintained at 0V regardless of input control signals HIN and LIN. These short circuit events may be detected by referring to respective input control signals HIN and LIN.

High-side and low-side input voltage sensing with filter circuit to provide a blanking time may be provided. The blanking time should be considered because there is always a delay time between a transition of the input control signal (e.g., from low to high or from high to low) and the behavior of the corresponding switching device. During this blanking time, the short circuit detection unit does not judge the status of the high-side or low-side because the output voltage is changing. The blanking time should be sufficient to allow the respective switching devices 11 and 12 to fully turn on before making a short circuit determination.

A judgement circuit used as the short circuit detection unit is configured to receive the input control signals HIN and LIN, the output voltage signal Vout, and two or more reference signals, and monitor for short circuit event at both the high-side switching device 12 and the low-side switching device 11 based on these signals. In particular, the HIN and LIN signals are used as enable signals for detecting the abnormal output voltage Vout.

In the event of detecting a short circuit event at either the high-side switching device 12 and the low-side switching device 11, the judgement circuit is configured to generate a fault signal that is feedback to the MCU, which can then react by, for example, turning off both switches 11 and 12.

Figure 3A:
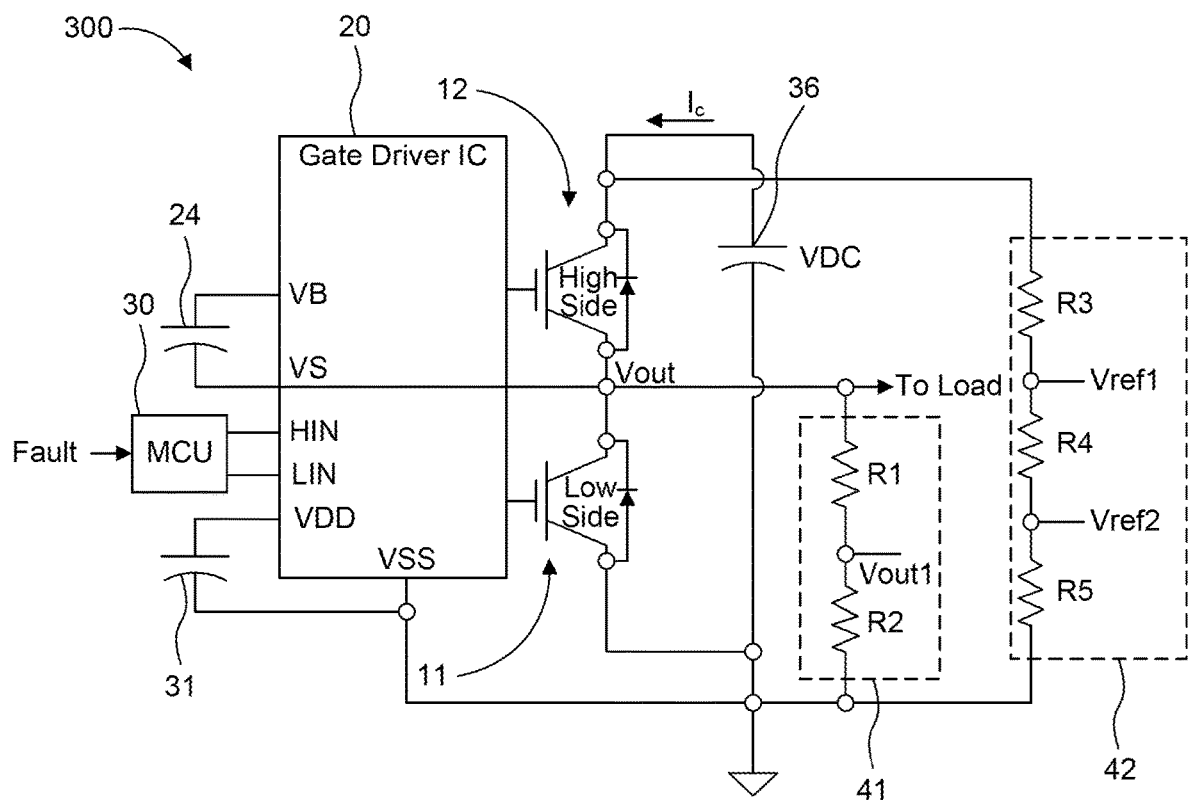
FIG. 3A is a schematic diagram of a gate driver circuit according to one or more embodiments.

FIG. 3A is a schematic diagram of a gate driver circuit 300 according to one or more embodiments. The gate driver circuit 300 includes an inverter leg, including transistors 11 and 12, and a gate driver IC 20 electrically coupled to the inverter leg, as similarly described in reference to FIG. 2. A bootstrap capacitor 31 couples Vdd to Vss. A DC voltage source 36 configured as a power supply rail is coupled to a load path terminal of the transistor 12 and a load path terminal of the transistor 11. In essence, voltage source 36 is an inverter leg power supply. As a result, a collector current Ic flows through either the high-side transistor switch 12 or the low-side transistor switch 11.

The gate driver circuit 300 further includes an MCU 30 configured to generate input control signals HIN and LIN and transmit them to the gate driver IC 20. The MCU 30 is also configured to receive fault and non-fault signals generated by a short circuit detection circuit 40 described in reference to FIG. 3B.

The gate driver circuit 300 further includes an output voltage Vout sensing circuit 41 and a VDC sensing circuit 42. In this example, the output voltage Vout sensing circuit 41 and the VDC sensing circuit 42 are shown to be external to the gate driver IC 20. However, it will be appreciated that one or both circuits 41 and 42 can be integrated within the gate driver IC 20.

The output voltage Vout sensing circuit 41 is coupled to the Vout node and includes a voltage divider made up of two resistors R1 and R2 (i.e., two resistive segments are formed) in order to read out a voltage Vout1 representative of the output voltage Vout.

The VDC sensing circuit 42 is configured to generate two reference voltages by tapping the power supply rail between which the transistor switches 11 and 12 are coupled. In particular, the VDC sensing circuit 42 includes a voltage divider made up of three resistors R3, R4, and R5 (i.e., three resistive segments are formed) in order to tap two reference voltages Vref1 and Vref2 therefrom, where Vref1 is greater than Vref1. Voltages Vout1, Vref1, and Vref2 are provided to a judgement circuit used as the short circuit detection unit, which also receives input control signals HIN and LIN, in order to monitor short circuit events occurring at either the high-side and the low-side.

Figure 3B:
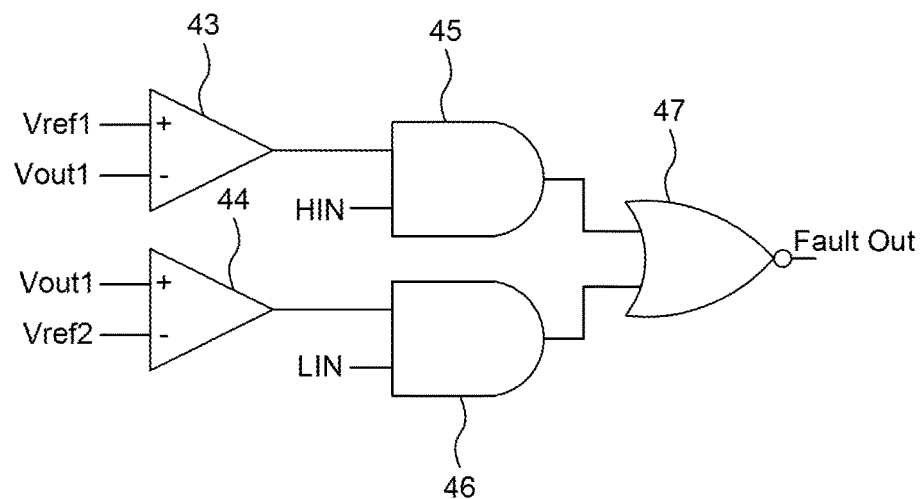
FIG. 3B is a schematic diagram of short circuit detection circuit to be coupled to a gate driver circuit according to one or more embodiments.

FIG. 3B is a schematic diagram of short circuit detection circuit 40 to be coupled to the gate driver circuit 300 according to one or more embodiments. The short circuit detection circuit 40 is a judgement circuit that may be implemented externally to the gate driver IC 20 of the gate driver circuit 300, or may be integrated therewith.

The short circuit detection circuit 40 is configured to monitor and detect a failure mode (i.e., a short circuit event) when a voltage drop of a respective transistor switch 11 or 12, while turned on, is higher than a specific percentage of the power supply rail voltage VDC.

In particular, the short circuit detection circuit 40 includes two comparators 43 and 44 each configured to receive the output voltage Vout1 from the output voltage Vout sensing circuit 41 at a respective input.

Comparator 43, used for monitoring a short circuit event at the high-side transistor switch 12, receives output voltage Vout1 at its negative input terminal. Comparator 43 also receives reference voltage Vref1 at its positive input terminal. As a result, the output of comparator 43 is 0 (i.e., logic low) when Vout1 is greater than Vref1 which indicates a normal operation. In contrast, when Vout1 is lower than Vref1, the output of comparator 43 is 1 (i.e., logic high) which indicates a possible fault (i.e., a possible short circuit event at the high-side transistor switch 12).

In order to verify whether a short circuit event is present, an AND gate 45 is provided along the high-side short circuit detection signal path. The AND gate 45 receives the output from comparator 43 as well as the high-side input control signal HIN. The high-side input control signal HIN acts as an enabling signal for short circuit detection. For example, a short circuit at the high-side transistor switch 12 can only be detected (i.e., enabled) if the high-side input control signal HIN is high, which indicates that the high-side transistor switch 12 is turned on. If operating normally, Vout1 should be greater than Vref1 when the high-side transistor switch 12 is turned on (i.e., when HIN is high), and should be less than Vref1 when switch 12 is turned off (i.e., when HIN is low). However, in the event of a short circuit, Vout1 will fall below Vref1 even when HIN is high. Thus, HIN can be used to discriminate actual fault events that occur when the switch 12 is turned on and HIN is high, and filter out non-fault events when HIN is low.

As a result, the AND gate 45 generates a fault indicator for the high-side transistor switch 12 as a logic high signal when Vout1 is lower than Vref1 (i.e., the output of comparator 43 is 1) and the input control signal HIN is high. In the alternative, the AND gate 45 generates a non-fault indicator for the high-side transistor switch 12 as a logic low signal when either Vout1 is greater than Vref1 or when HIN is low.

An XOR gate 47 receives the fault indicator or the non-fault indicator, and outputs a fault signal or a non-fault signal depending on receiving the fault indicator or the non-fault indicator from AND gate 45, and also depending on the type of indicator received from AND gate 46. The fault output signal is active low for when a fault is detected.

Comparator 44, used of monitoring a short circuit event at the low-side transistor switch 11, receives output voltage Vout1 at its positive input terminal. Comparator 44 also receives reference voltage Vref2 at its negative input terminal. As a result, the output of comparator 44 is 0 (i.e., logic low) when Vout1 is less than Vref2 which indicates a normal operation. In contrast, when Vout1 is greater than Vref2, the output of comparator 44 is 1 (i.e., logic high) which indicates a possible fault (i.e., a possible short circuit event at the low-side transistor switch 11).

In order to verify whether a short circuit event is present, an AND gate 46 is provided along the low-side short circuit detection signal path. The AND gate 46 receives the output from comparator 44 as well as the low-side input control signal LIN. The low-side input control signal LIN acts as an enabling signal for short circuit detection. For example, a short circuit at the low-side transistor switch 11 can only be detected (i.e., enabled) if the low-side input control signal LIN is high, which indicates that the low-side transistor switch 11 is turned on. If operating normally, Vout1 should be less than Vref2 when the low-side transistor switch 11 is turned on (i.e., when LIN is high), and should be greater than Vref2 when switch 11 is turned off (i.e., when LIN is low). However, in the event of a short circuit, Vout1 will rise above Vref2 even when LIN is high. Thus, LIN can be used to discriminate actual fault events that occur when the switch 11 is turned on and LIN is high, and filter out non-fault events when LIN is low.

As a result, the AND gate 46 generates a fault indicator for the low-side transistor switch 11 as a logic high signal when Vout1 is greater than Vref2 (i.e., the output of comparator 44 is 1) and the input control signal LIN is high. In the alternative, the AND gate 46 generates a non-fault indicator for the low-side transistor switch 11 as a logic low signal when either Vout1 is less than Vref2 or when LIN is low.

The XOR gate 47 receives the fault indicator or the non-fault indicator, and outputs a fault signal or a non-fault signal depending on receiving the fault indicator or the non-fault indicator from AND gate 46, and also depending on the type of indicator received from AND gate 45. The fault output signal is active low for when a fault is detected.

As an example, a failure mode can be detected when the voltage drop of each turned on switch is higher than specific percentage of VDC. For example, the percentage may be 10%. Thus, the detection voltage of Vce is about 10% VDC. Resistor values may be selected as follows: R1=200 ohms; R2=2.3 ohms, R3=200 ohms, R4=1.85 ohms, and R5=0.25 ohms. Thus, reference voltage Verf1 may be set at about 90% (i.e., 85%-95%) of VDC, whereas reference voltage Vref2 may be set at about 10% (i.e., 5%-15%) of VDC. In addition, VDC=300V. As a result, Vref1=3.12V and Vref2=0.37V. Under this scenario, when Vout1 is lower than 274.2V at high-side turn on (i.e., when HIN is high), failure mode can be detected. Additionally, when Vout1 is higher than 32.6V at low-side turn on (i.e., when LIN is high), failure mode can be detected.

Figure 4:
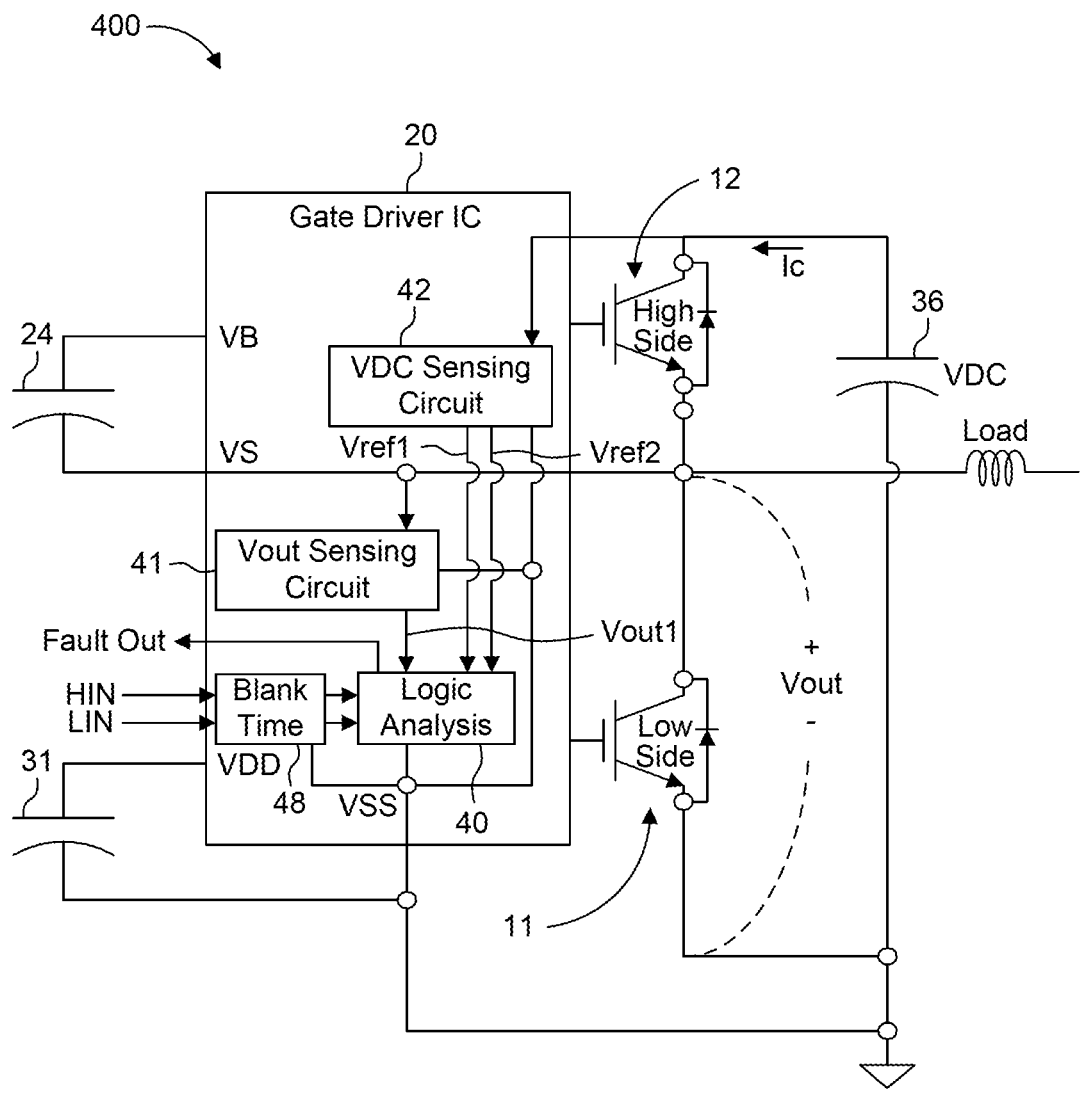
FIG. 4 is a schematic diagram of a gate driver circuit according to one or more embodiments.

FIG. 4 is a schematic diagram of a gate driver circuit 400 according to one or more embodiments. Gate driver circuit 400 applies the same principles discussed above in conjunction with FIGS. 3A and 3B, except the short circuit detection circuit 40, the Vout sensing circuit 41, and the VDC sensing circuit 42 are integrated within the gate driver IC 20. In addition, a blanking time circuit 48 is provided and is configured to apply a turn-on delay time to the input control signals HIN and LIN.

Figure 5A:
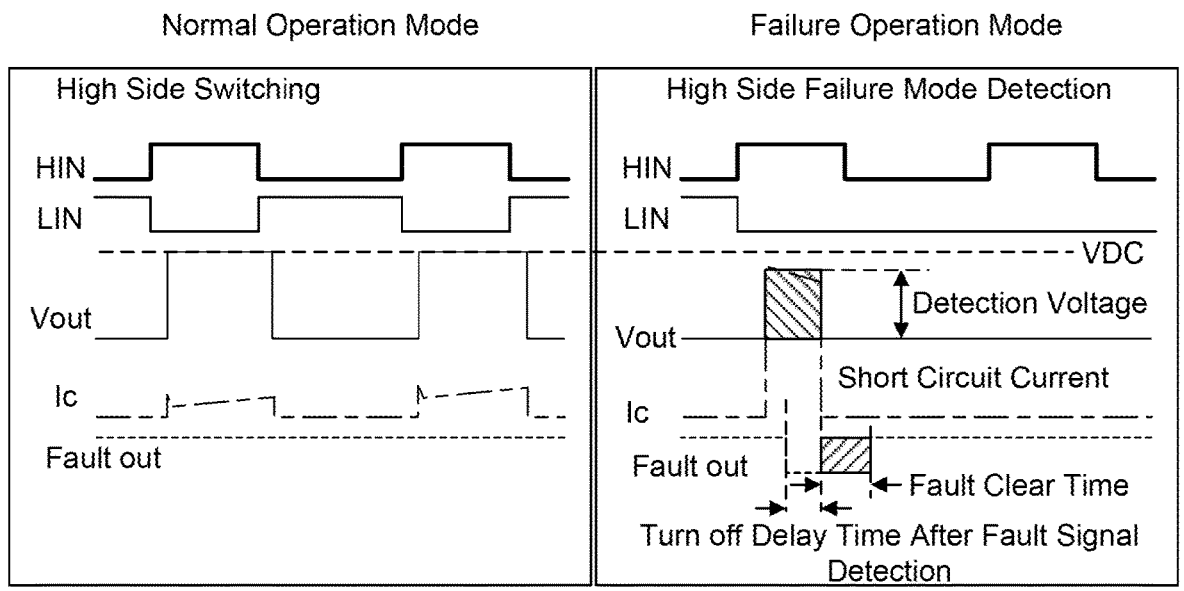
FIGS. 5A and 5B illustrate signal diagrams under normal operation mode and failure operation mode for high-side switching and low-side switching, respectively, according to one or more embodiments.
Figure 5B:
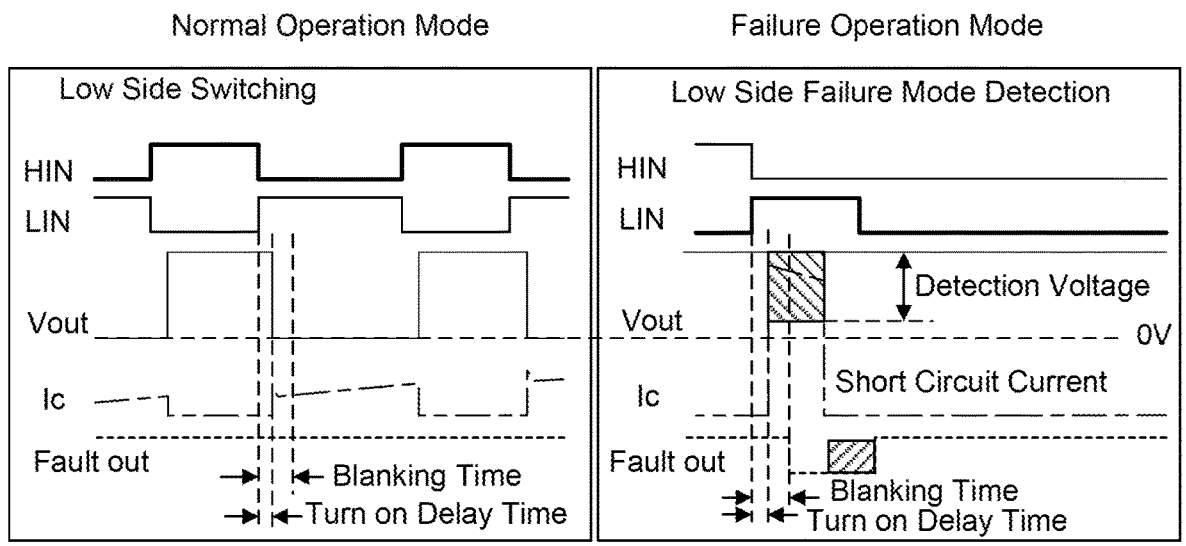

FIGS. 5A and 5B illustrate signal diagrams under normal operation mode and failure operation mode for high-side switching and low-side switching, respectively, according to one or more embodiments. Here, signals HIN, LIN, Vout, Ic, and fault out are shown for both high-side switching (normal operation mode and fault operation mode) and low-side switching (normal operation mode and fault operation mode).

In view of the above, a short circuit detection circuit is configured to detect a short circuit event at either of the high-side and low-side switching devices by a single-point voltage potential Vout. Thus, the short circuit detection circuit is configured to monitor for the short circuit events at the high-side power transistor and at the low-side power transistor simultaneously using the output voltage measurement Vout1 as a single point voltage potential for detecting both a high-side short circuit event at the high-side power transistor and a low-side short circuit event at the low-side power transistor. This concept can be implemented to all gate drive systems of full bridge, half bridge, and three-phase. It also simplifies a printed circuit board (PCB) layout (or internal structure) by providing a single protection function for both the high-side and low-side switching devices.

While various embodiments have been described, it will be apparent to those of ordinary skill in the art that many more embodiments and implementations are possible within the scope of the disclosure. For example, while some embodiments may be directed to a load being a motor that is connected to a half bridge/inverter and implementing an MCU as a microcontroller connected to the gate driver 20, the short circuit detection is not limited thereto. For example, the short circuit detection described in the foregoing embodiments may be used for other loads and in cases in which the microcontroller 30 is not an MCU. One example may be for high power welding in which the short circuit detection is implemented.

Accordingly, the invention is not to be restricted except in light of the attached claims and their equivalents. With regard to the various functions performed by the components or structures described above (assemblies, devices, circuits, systems, etc.), the terms (including a reference to a "means") used to describe such components are intended to correspond, unless otherwise indicated, to any component or structure that performs the specified function of the described component (i.e., that is functionally equivalent), even if not structurally equivalent to the disclosed structure that performs the function in the exemplary implementations of the invention illustrated herein.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or in the claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

Instructions may be executed by one or more processors, such as one or more central processing units (CPU), digital signal processors (DSPs), general purpose microprocessors, application specific integrated circuits (ASICs), field programmable logic arrays (FPGAs), or other equivalent integrated or discrete logic circuitry. Accordingly, the term "processor," as used herein refers to any of the foregoing structure or any other structure suitable for implementation of the techniques described herein. In addition, in some aspects, the functionality described herein may be provided within dedicated hardware and/or software modules. Also, the techniques could be fully implemented in one or more circuits or logic elements.

Thus, the techniques described in this disclosure may be implemented, at least in part, in hardware, software, firmware, or any combination thereof. For example, various aspects of the described techniques may be implemented within one or more processors, including one or more microprocessors, DSPs, ASICs, or any other equivalent integrated or discrete logic circuitry, as well as any combinations of such components.

A control unit including hardware may also perform one or more of the techniques described in this disclosure. Such hardware, software, and firmware may be implemented within the same device or within separate devices to support the various techniques described in this disclosure. Software may be stored on a non-transitory computer-readable medium such that the non-transitory computer readable medium includes a program code or a program algorithm stored thereon which, when executed, causes a computer program to perform the steps of a method.

Although various exemplary embodiments have been disclosed, it will be apparent to those skilled in the art that various changes and modifications can be made which will achieve some of the advantages of the concepts disclosed herein without departing from the spirit and scope of the invention. It will be obvious to those reasonably skilled in the art that other components performing the same functions may be suitably substituted. It is to be understood that other embodiments may be utilized and structural or logical changes may be made without departing from the scope of the present invention. It should be mentioned that features explained with reference to a specific figure may be combined with features of other figures, even in those not explicitly mentioned. Such modifications to the general inventive concept are intended to be covered by the appended claims and their legal equivalents.

What is claimed is:

1. A gate driver circuit, comprising:
a high-side power transistor;

a low-side power transistor coupled to the high-side power transistor, wherein an output voltage is generated at a load node coupled between the low-side power transistor and the high-side power transistor;

a gate driver configured to receive a high-side control signal and a low-side control signal, drive the high-side power transistor based on the high-side control signal, and drive the low-side power transistor based on the low-side control signal; and a short circuit detection circuit configured to monitor for short circuit events at the high-side power transistor and at the low-side power transistor based on a delayed high-side control signal, a delayed low-side control signal, and the output voltage, and, generate a fault signal in response to detecting a short circuit event at either of the high-side power transistor or the low-side power transistor;

a blanking time circuit configured to apply a turn-on delay time to the high-side control signal and the low-side control signal to generate the delayed high-side control signal and the delayed low-side control signal, respectively, wherein the blanking time provides the delayed high-side control signal and the delayed low-side control signal to the short circuit detection circuit.

2. The gate driver circuit of claim 1, wherein:

the short circuit detection circuit is configured to compare an output voltage measurement representative of the output voltage to an upper reference voltage and detect a high-side short circuit event at the high-side power transistor on a condition that the output voltage measurement is less than the upper reference voltage and on a condition that the delayed high-side control signal has a high signal level, and the short circuit detection circuit is configured to detect a normal operation at the high-side power transistor on a condition that the output voltage measurement is equal to or greater than the upper reference voltage or on a condition that the delayed high-side control signal has a low signal level.

3. The gate driver circuit of claim 1, wherein:

the short circuit detection circuit is configured to compare an output voltage measurement representative of the output voltage to a lower reference voltage and detect a low-side short circuit event at the low-side power transistor on a condition that the output voltage measurement is greater than the lower reference voltage and on a condition that the delayed low-side control signal has a high signal level, and the short circuit detection circuit is configured to detect a normal operation at the low-side power transistor on a condition that the output voltage measurement is equal to or less than the lower reference voltage or on a condition that the delayed low-side control signal has a low signal level.

4. The gate driver circuit of claim 1, wherein:

the short circuit detection circuit is configured to compare an output voltage measurement representative of the output voltage to an upper reference voltage and detect a high-side short circuit event at the high-side power transistor on a condition that the output voltage measurement is less than the upper reference voltage and on a condition that the delayed high-side control signal has a high signal level, and the short circuit detection circuit is configured to compare an output voltage measurement representative of the output voltage to a lower reference voltage and detect a low-side short circuit event at the low-side power transistor on a condition that the output voltage measurement is greater than the lower reference voltage and on a condition that the delayed low-side control signal has a high signal level.

5. The gate driver circuit of claim 4, further comprising:

a DC power supply configured to generate a DC voltage, the DC power supply being directly coupled to a load path terminal of the high-side power transistor and directly to a load path terminal of the low-side power transistor, wherein the upper reference voltage is a first predefined percentage of the DC voltage and the lower reference voltage is a second predefined percentage of the DC voltage, wherein the upper reference voltage is greater than the lower reference voltage.

6. The gate driver circuit of claim 5, wherein:

the upper reference voltage defines a high-side normal operating range that extends from the upper reference voltage to the DC voltage, and the lower reference voltage defines a low-side normal operating range that extends from 0V to the lower reference voltage.

7. The gate driver circuit of claim 5, further comprising:

a VDC sensing circuit having a sensing path directly coupled to the load path terminal of the high-side power transistor and directly to the load path terminal of the low-side power transistor, wherein the sensing path comprises a first tap configured to tap the upper reference voltage and a second tap configured to tap the lower reference voltage from the DC voltage, and the first tap and the second tap are configured to provide the upper reference voltage and the lower reference voltage to the short circuit detection circuit, respectively, wherein the first tap and the second tap are arranged sequentially along a sensing path with at least one current impeding element therebetween.

8. The gate driver circuit of claim 7, wherein the gate driver, the short circuit detection circuit, and the VDC sensing circuit are integrated on a gate driver integrated circuit.

9. The gate driver circuit of claim 1, further comprising:

an output voltage sensing circuit coupled to the output voltage and configured to tap the output voltage measurement representative of the output voltage, and provide the output voltage measurement to the short circuit detection circuit.

10. The gate driver circuit of claim 9, wherein the gate driver, the short circuit detection circuit, and the output voltage sensing circuit are integrated on a gate driver integrated circuit.

11. The gate driver circuit of claim 1, wherein the short circuit detection circuit is configured to receive the high-side control signal and the low-side control signal from a microcontroller.

12. The gate driver circuit of claim 1, wherein the short circuit detection circuit is configured to simultaneously monitor for the short circuit events at the high-side power transistor and at the low-side power transistor using an output voltage measurement representative of the output voltage as a single point voltage potential for detecting both a high-side short circuit event at the high-side power transistor and a low-side short circuit event at the low-side power transistor.

13. The gate driver circuit of claim 1, wherein:

the short circuit detection circuit is configured to use the delayed high-side control signal as an enable signal for generating the fault signal corresponding to a high-side short circuit event at the high-side power transistor, and the short circuit detection circuit is configured to use the delayed low-side control signal as an enable signal for generating the fault signal corresponding to a low-side short circuit event at the low-side power transistor.

14. The gate driver circuit of claim 1, further comprising:
a microcontroller configured to generate the high-side control signal and the low-side control signal, and transmit the high-side control signal and a low-side control signal to the gate driver,
wherein the microcontroller is further configured to receive the fault signal and control the gate driver to turn off the high-side power transistor and the low-side power transistor in response to receiving the fault signal.

15. The gate driver circuit of claim 1, wherein the high-side control signal and the low-side control signals are pulse width modulation (PWM) control signals.

16. The gate driver circuit of claim 1, wherein the turn-on delay time extends from a turn-on time of the high-side control signal or the low-side control signal to a point at which desaturation detection is activated at the short circuit detection circuit in order to avoid false detection of the short circuit event.

17. The gate driver circuit of claim 1, wherein the gate driver comprises:
a first pre-driver and buffer circuit configured to receive the delayed high-side control signal and drive the high-side power transistor based on the delayed high-side control signal; and
a second pre-driver and buffer circuit configured to receive the delayed low-side control signal and drive the low-side power transistor based on the delayed lowed-side control signal.

18. A method of detecting short circuit events in an inverter leg of an inverter, the method comprising:
receiving a high-side control signal and a low-side control signal;
driving a high-side power transistor of the inverter leg based on the high-side control signal;
driving a low-side power transistor based on the low-side control signal;
generating an output voltage at a load node coupled between the low-side power transistor and the high-side power transistor based on driving the high-side power transistor and driving the low-side power transistor;
generating a delayed high-side control signal by applying a turn-on delay time to the high-side control signal;
generating a delayed low-side control signal by applying a turn-on delay time to the low-side control signal;
monitoring for short circuit events at the high-side power transistor and at the low-side power transistor based on the delayed high-side control signal, the delayed low-side control signal, and the output voltage; and
generating a fault signal in response to detecting a short circuit event at either of the high-side power transistor or the low-side power transistor.

19. The method of claim 18, wherein monitoring for the short circuit events at the high-side power transistor and at the low-side power transistor comprises:

comparing an output voltage measurement representative of the output voltage to an upper reference voltage;
detecting a high-side short circuit event at the high-side power transistor on a condition that the output voltage measurement is less than the upper reference voltage and on a condition that the delayed high-side control signal has a high signal level; and
detecting a normal operation at the high-side power transistor on a condition that the output voltage measurement is equal to or greater than the upper reference voltage or on a condition that the delayed high-side control signal has a low signal level.

20. The method of claim 18, wherein monitoring for the short circuit events at the high-side power transistor and at the low-side power transistor comprises:
comparing an output voltage measurement representative of the output voltage to a lower reference voltage;
detecting a low-side short circuit event at the low-side power transistor on a condition that the output voltage measurement is greater than the lower reference voltage and on a condition that the delayed low-side control signal has a high signal level; and
detecting a normal operation at the low-side power transistor on a condition that the output voltage measurement is equal to or less than the lower reference voltage or on a condition that the delayed low-side control signal has a low signal level.

21. The method of claim 18, wherein monitoring for the short circuit events at the high-side power transistor and at the low-side power transistor comprises:
comparing an output voltage measurement representative of the output voltage to an upper reference voltage;
detecting a high-side short circuit event at the high-side power transistor on a condition that the output voltage measurement is less than the upper reference voltage and on a condition that the delayed high-side control signal has a high signal level;
comparing an output voltage measurement representative of the output voltage to a lower reference voltage; and
detecting a low-side short circuit event at the low-side power transistor on a condition that the output voltage measurement is greater than the lower reference voltage and on a condition that the delayed low-side control signal has a high signal level.

22. The method of claim 18, wherein monitoring for the short circuit events at the high-side power transistor and at the low-side power transistor comprises:
simultaneously monitoring for the short circuit events at the high-side power transistor and at the low-side power transistor using an output voltage measurement representative of the output voltage as a single point voltage potential for detecting both a high-side short circuit event at the high-side power transistor and a low-side short circuit event at the low-side power transistor.

23. The method of claim 18, wherein the turn-on delay time extends from a turn-on time of the high-side control signal or the low-side control signal to a point at which desaturation detection is activated in order to avoid false detection of the short circuit event.

* * * * *